United States Patent
Hsu et al.

(10) Patent No.: US 12,500,157 B2
(45) Date of Patent: Dec. 16, 2025

(54) SEMICONDUCTOR PACKAGE DEVICE WITH INTEGRATED INDUCTOR AND MANUFACTURING METHOD THEREOF

(71) Applicant: TAIWAN SEMICONDUCTOR MANUFACTURING COMPANY LTD., Hsinchu (TW)

(72) Inventors: Ying-Chih Hsu, Hsinchu (TW); Wen-Shiang Liao, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/744,728

(22) Filed: Jun. 17, 2024

(65) Prior Publication Data

US 2024/0355720 A1  Oct. 24, 2024

Related U.S. Application Data

(63) Continuation of application No. 17/816,264, filed on Jul. 29, 2022, now Pat. No. 12,046,544, which is a continuation of application No. 16/727,930, filed on Dec. 27, 2019, now Pat. No. 11,450,595.

(51) Int. Cl.
| | |
|---|---|
| H01L 23/498 | (2006.01) |
| H01F 27/28 | (2006.01) |
| H01F 41/04 | (2006.01) |
| H01L 21/48 | (2006.01) |
| H01L 23/00 | (2006.01) |
| H01L 23/64 | (2006.01) |
| H01L 25/065 | (2023.01) |
| H10D 1/20 | (2025.01) |

(52) U.S. Cl.
CPC ... *H01L 23/49822* (2013.01); *H01F 27/2804* (2013.01); *H01F 41/041* (2013.01); *H01L 21/4853* (2013.01); *H01L 21/4857* (2013.01); *H01L 23/49816* (2013.01); *H01L 23/49866* (2013.01); *H01L 23/645* (2013.01); *H01L 24/16* (2013.01); *H01L 25/0655* (2013.01); *H10D 1/20* (2025.01); *H01F 2027/2809* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 11,158,448 B2* | 10/2021 | Roth | H01F 41/046 |
| 2018/0040420 A1* | 2/2018 | Poddar | H01F 41/046 |
| 2019/0333875 A1* | 10/2019 | Liao | H01F 27/2895 |
| 2019/0385775 A1* | 12/2019 | Roth | H01L 24/97 |

* cited by examiner

*Primary Examiner* — Long Pham
(74) *Attorney, Agent, or Firm* — WPAT LAW; Anthony King

(57) ABSTRACT

A method of manufacturing a semiconductor device is provided. A permalloy device is received. An interposer die is formed. A conductive coil is formed over a substrate, and the conductive coil includes a bottom metal layer over the substrate, a middle metal layer and a top metal layer interconnected to each other. The permalloy device is disposed in the middle metal layer through a pick and place operation before forming the top metal layer of the conductive coil. A semiconductor die is bonded to the interposer die. The permalloy device has a polygonal ring shape wrapped with the conductive coil.

20 Claims, 16 Drawing Sheets

SEMICONDUCTOR PACKAGE DEVICE WITH INTEGRATED INDUCTOR AND MANUFACTURING METHOD THEREOF

PRIORITY CLAIM AND CROSS-REFERENCE

This application is a Continuation of U.S. application Ser. No. 17/816,264, filed on Jul. 29, 2022, which is a Continuation of U.S. application Ser. No. 16/727,930, filed on Dec. 27, 2019, now U.S. Pat. No. 11,450,595, the entirety of which are incorporated by reference herein.

BACKGROUND

In modern semiconductor devices and systems, progress in component integration and miniaturization has taken place at an increasingly rapid pace. One increasingly important challenge in the manufacture of modern semiconductor package devices is the integration of inductors. Conventional inductors usually occupy a considerable amount of space in an electronic device for pursuing desirable performance. However, the size of the inductor makes it difficult for conventional inductor designs to be integrated with downsized semiconductor chips. Thus, an enhanced integrated inductor structure and a method of manufacturing the same are in need.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
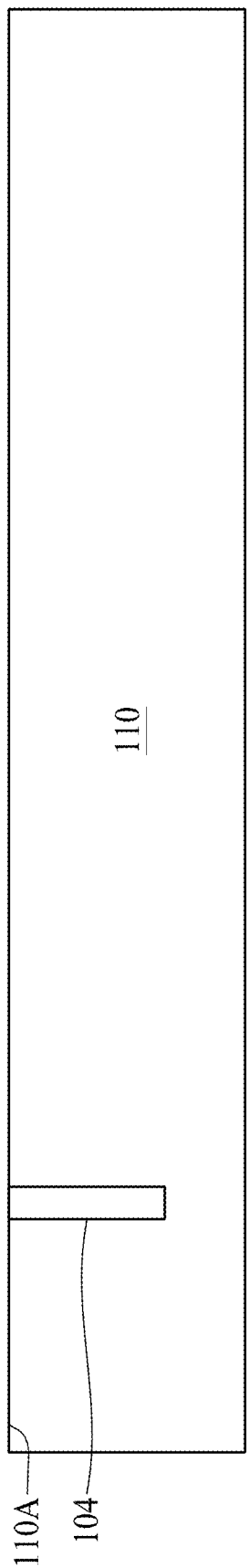
FIGS. 1 through 8 are cross-sectional views of intermediate structures for a method of manufacturing a semiconductor package device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "approximate," "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The present disclosure provides a semiconductor package device integrated with an on-chip inductor and its associated manufacturing operations, according to various embodiments. An inductor is an indispensable component in many aspects of modern semiconductor electronics, such as sensors, transformers, power management circuits, charging circuits and radio-frequency circuits. However, as the size of a packaged semiconductor device continues to shrink, the miniaturization of an inductor has drawn attention as a key step necessary to successfully reduce the dimensions of the packaged semiconductor device. To address such need, a miniaturized on-chip inductor is proposed. Material of a core of the miniaturized on-chip inductor includes permalloy with high permeability coefficient. Permeability coefficient for permalloy of a material of NiFe ranges from about 1,000 to about 1,000,000 H/m. In addition, conductive coils of the miniaturized on-chip inductor are produced by using techniques common to fabrication of semiconductor devices, such as lithography, etching, and deposition. In further detail, a semiconductor package device is manufactured by, for example, a chip on wafer on substrate (CoWoS) process. A conductive coil of an inductor of the semiconductor package device is also manufactured by the CoWoS process, whereas the core is integrated into the semiconductor package device by a pick-and-place (hereinafter, called PnP) process. A PnP process is compatible with a CoWoS process. Complexity of a manufacturing process of the semiconductor package device is not significantly increased accordingly. That is, manufacturing efficiency is not adversely affected. Moreover, taking an advantage of high permeability coefficient of material of permalloy, for a given inductance, compared to the conventional inductor, the proposed on-chip inductor has a smaller size. As a result, the resultant inductor-embedded package device renders better inductor performance with a reduced device size.

FIGS. 1 through 8 and FIGS. 10 through 15 are cross-sectional views of intermediate structures for a method of manufacturing a semiconductor package device 100, in accordance with some embodiments. The semiconductor package device 100 may be an electronic device, such as a sensor, a transformer, a power management integrated circuit (IC), a wireless charger device, or a radio-frequency transmitter/receiver. It should be noted that cross-sectional views of intermediate structures shown in FIGS. 1 to 8 are taken along a line A-A' shown in FIG. 9A. Moreover, for convenience, in FIGS. 10 to 14, intermediate structures taken along lines A-A' and B-B' shown in FIG. 9A are shown in a single cross-sectional view.

Referring to FIG. 1, a substrate 110 is received or provided. The substrate 110 includes a semiconductor material, such as silicon. In an embodiment, the substrate 110 may include other semiconductor materials, such as silicon germanium, silicon carbide, gallium arsenide, or the like.

In some embodiments, the substrate 110 may be a p-type semiconductive substrate (acceptor type) or an n-type semiconductive substrate (donor type). Alternatively, in various applications the substrate 110 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof.

In the present embodiment, the substrate 110 is an interposer substrate formed of bulky silicon. Conductive vias may be formed in the substrate to electrically couple components on opposite sides of the substrate 110. In some embodiments, the substrate 110 may be substantially free of active devices, such as transistors, or passive devices, such as resistors, capacitors or inductors, in addition to the conductive vias.

In addition, a through-silicon via (TSV) 104 is formed in the substrate 110. However, the present disclosure is not limited thereto. In other embodiments, other types of vias may replace TSVs to be formed in the substrate 110. For forming the TSV 104, some following exemplary processes may be applied. For example, an opening is formed in a surface 110A of the substrate 110 by, for example, performing an etching operation on the surface 110A of the substrate 110 to form the opening. In some embodiments, the etching operation may be a dry etch, a wet etch, or a combination thereof. In the depicted embodiment, a dry etch or a reactive ion etching (RIE) operation is adopted. Although not shown, a photoresist layer may be formed over the substrate 110 to define the geometry of the opening where the TSV 104 to be formed. Furthermore, after the opening is formed, the photoresist layer may be cleaned or stripped.

In some embodiments, before forming the TSV 104, a protection layer (not shown) is optionally formed on the substrate 110. The protection layer may line sidewalls and the bottom of the opening. The protection layer may be formed of a dielectric material, such as silicon oxide, silicon nitride, silicon oxynitride, or the like. The protection layer may be formed using chemical vapor deposition (CVD), physical vapor deposition (PVD), atomic layer deposition (ALD), spin-on coating, or the like.

The TSV 104 is formed in the opening by disposing a conductive material in the opening by means of, for example, CVD, PVD, ALD, electroplating, or other suitable methods. Afterwards, excess conductive materials may be removed by a planarization operation, such as grinding or chemical mechanical polishing (CMP). Accordingly, the TSV 104 is level with the surface 110A of the substrate 110. In some embodiments, the TSV 104 acts as through-interposer vias of the semiconductor package device 100. The TSV 104 is made of a conductive material such as copper, tungsten, titanium, aluminum, silver, combinations thereof, or the like.

Figure 6:
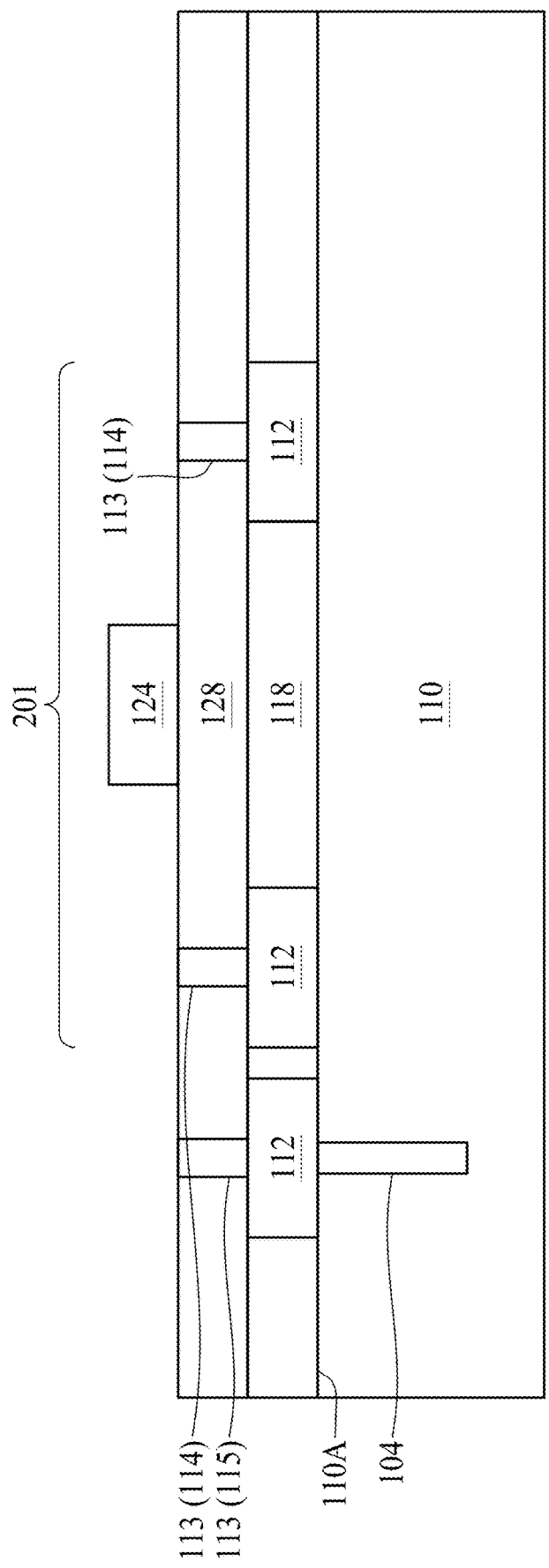
Figure 7:
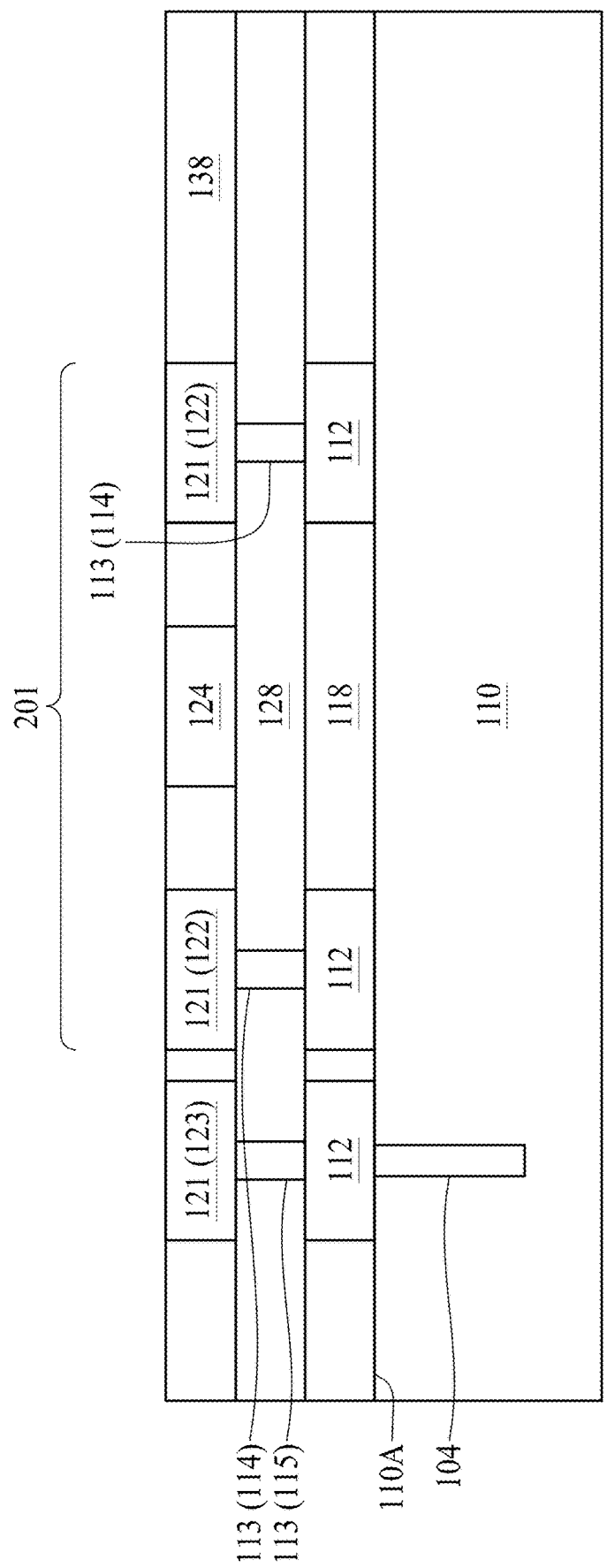
Figure 8:
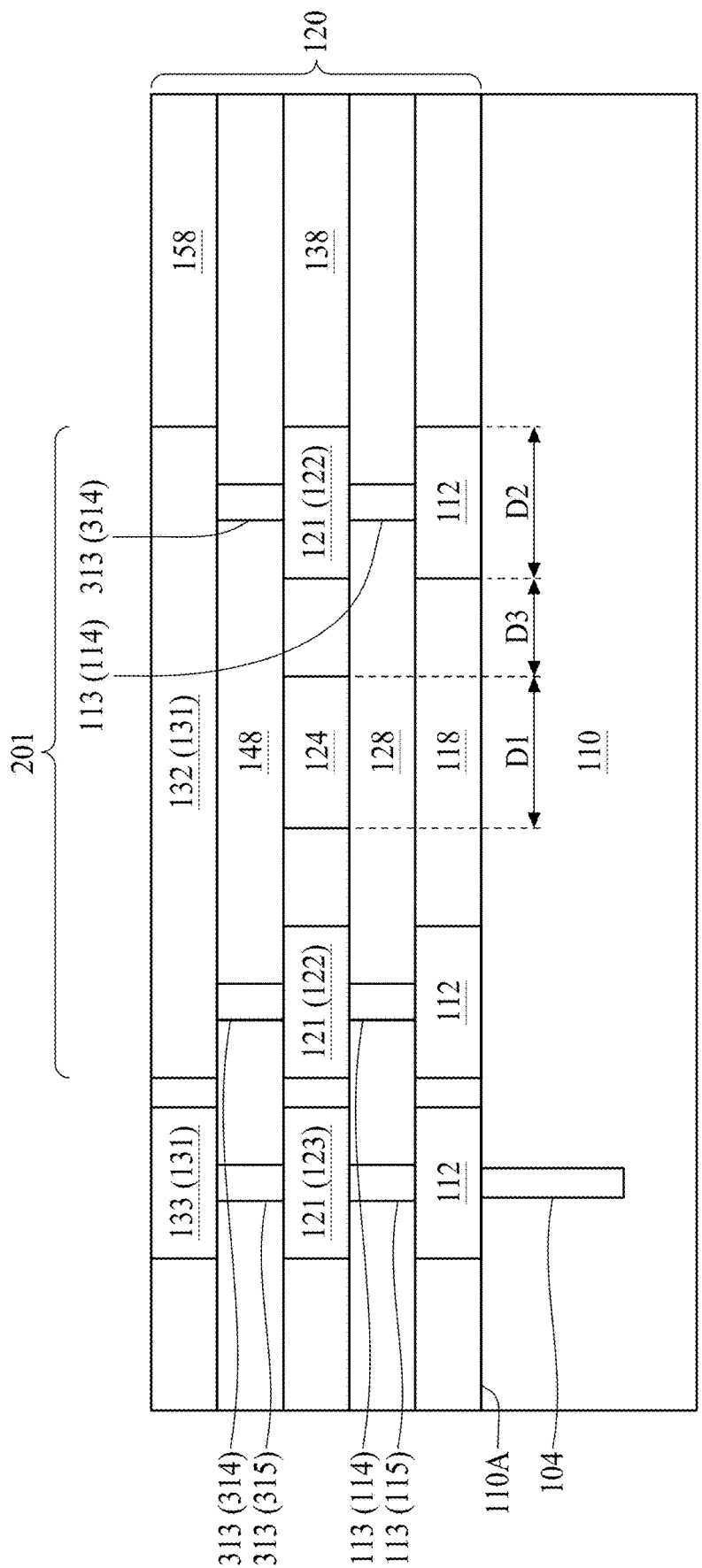
Figure 9A:
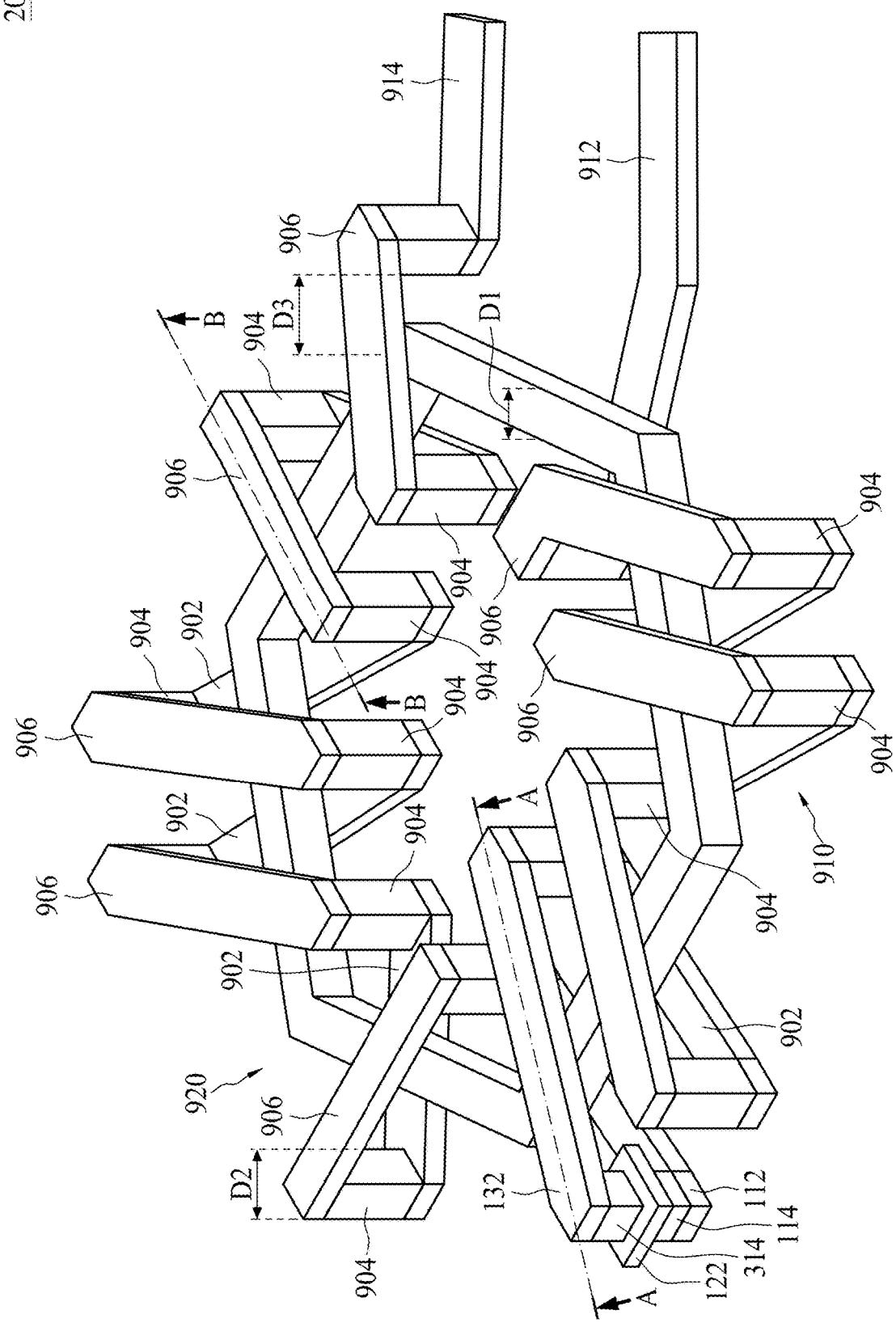
FIGS. 9A and 9B are schematic perspective views of an inductor in a semiconductor package device, in accordance with some embodiments.

FIG. 2 through FIG. 8 illustrate cross-sectional views of intermediate structures in a metallization process of forming an interconnect structure 120 shown in FIG. 8, in accordance with various embodiments. The interconnect structure 120, also known as a redistribution layer (RDL), is widely applied in semiconductor circuits in order to provide rerouted interconnections between components on one side of an interconnect structure, such as the interconnect structure 120. In some embodiments, the interconnect structure 120 is configured to electrically couple components on different sides of the interconnect structure 120. The interconnect structure 120 generally includes stacked interconnection layers comprised of conductive features connected with each other to establish the interconnection routes. For example, an interconnection layer includes a via layer and a metal layer.

Figure 2:
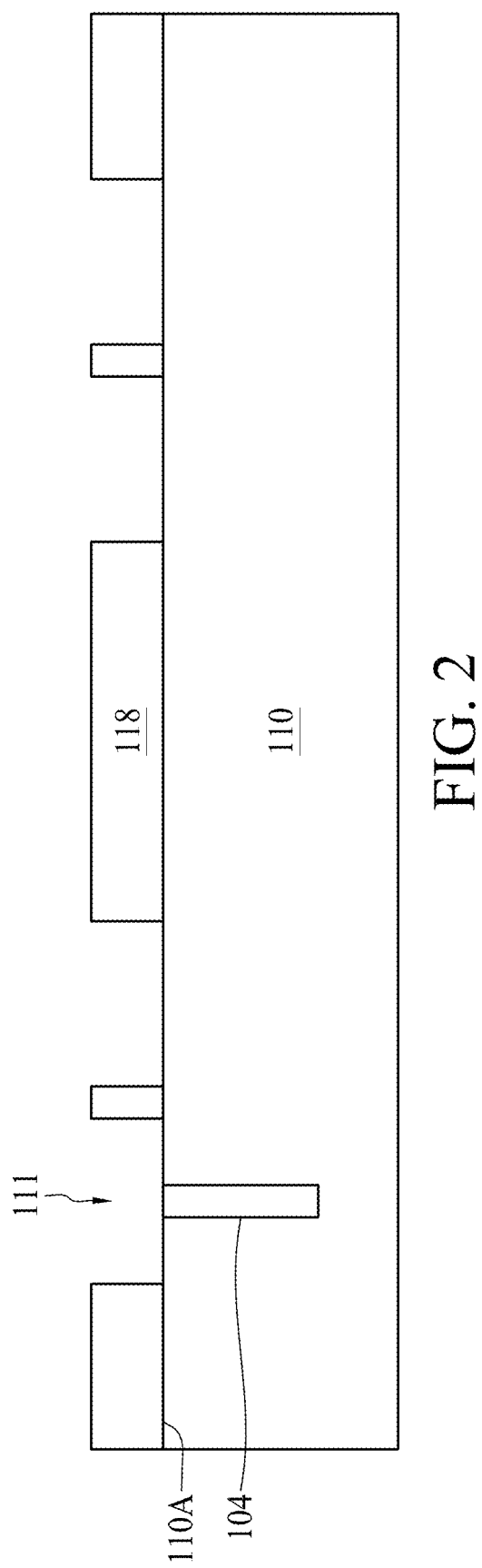

Initially, as illustrated in FIG. 2, a patterned inter-metal-dielectric (IMD) layer 118 is formed on the substrate 110 by, for example, deposition operations, exposing portions of the substrate 110 and the TSV 104 through the opening 111. In some embodiments, an exemplary process of forming the patterned IMD layer 118 includes a deposition operation, a lithography operation and an etching operation performed in turn. In some embodiments, a deposition operation includes CVD, PVD, ALD, or other suitable operations. In some embodiments, the patterned IMD layer 118 is formed in a blanket manner over the substrate 110. In some embodiments, the etching operation may be dry etch, wet etch, or a combination thereof.

In some embodiments, the patterned IMD layer 118 comprises silicon oxide, silicon nitride (SiN), silicon oxynitride, silicon carbide, or the like. In some embodiments, the patterned IMD layer 118 comprises oxide, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

Some of the openings 111 are aligned with the underlying TSV 104 to expose the TSV 104 and portions of a protection layer. Although not shown in the figure, each of the openings 111 may have a strip shape extending in a horizontal direction substantially parallel to the surface 110A of the substrate 110.

Figure 3:
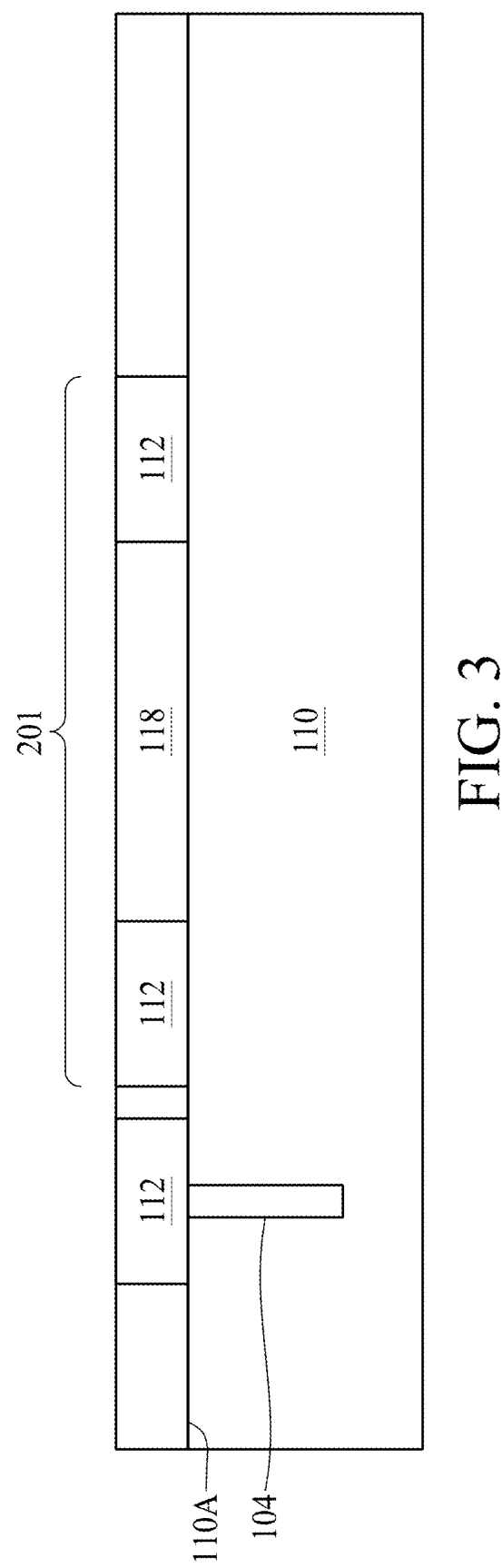

Referring to FIG. 3, a patterned metal layer 112 is formed in the patterned IMD layer 118. In this case, the patterned metal layer 112 is formed over the substrate 110. An exemplary process of forming the patterned metal layer 112 includes disposing a conductive material onto the first surface 110A at the exposed portions by, for example, CVD, PVD, ALD, plating, or other suitable methods. The conductive material is such as titanium, copper, silver, aluminum, gold, tungsten, combinations thereof, or the like. In some embodiments, the patterned metal layer 112 is made of highly conductive materials, such as copper, in order to reduce conduction resistance. In some embodiments, a planarization operation, such as grinding or CMP, may be utilized to level upper surfaces of the patterned metal layer 112 and the patterned IMD layer 118.

In addition, as shown in FIG. 3, an inductor zone 201 is defined for placing the inductor 200 in the subsequent operation. A metal line of the patterned metal layer 112 within the inductor zone 201 is used as components of the inductor 200. The metal line within the inductor zone 201 that is configured to perform the function of the inductor 200 may be electrically isolated from other conductive components, such as the metal line of the patterned metal layer 112 outside of the inductor zone 201. The metal line of the patterned metal layer 112 outside the inductor zone 201, such as the leftmost metal line of the patterned metal layer 112 in FIG. 3, may serve as an interconnection route and may be configured for interconnecting devices or components of the semiconductor package device 100 on both sides of the interconnect structure 120.

Figure 4:
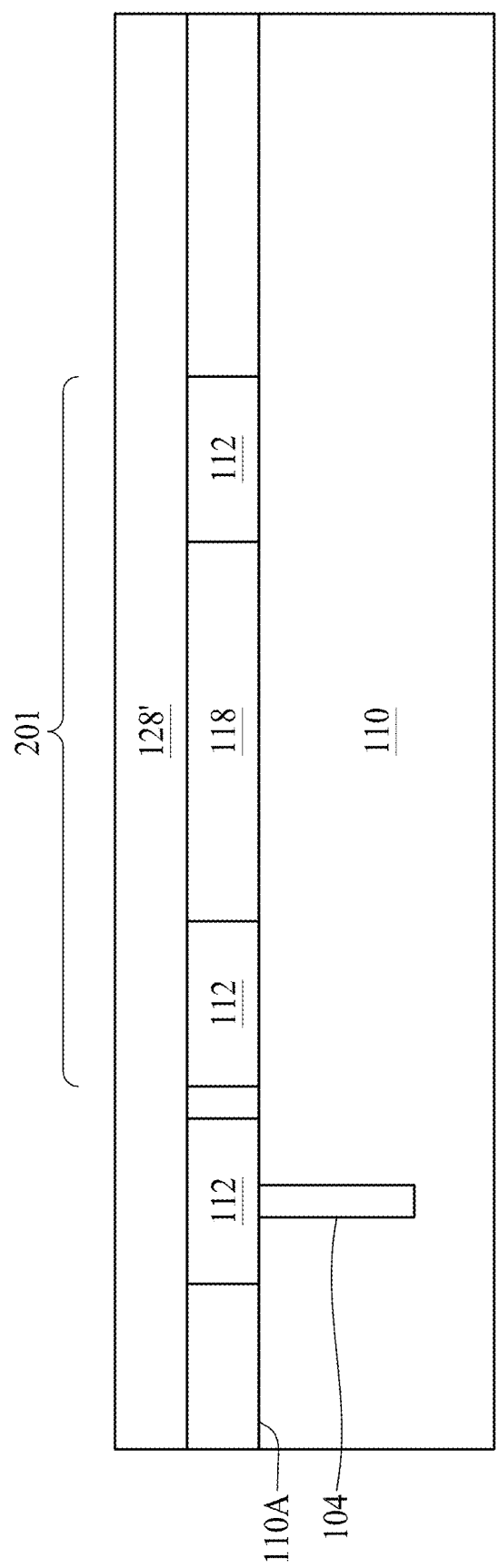

Referring to FIG. 4, an IMD layer 128' is formed on the patterned IMD layer 118 and the patterned metal layer 112. In some embodiments, an interface between the IMD layer 128' and the patterned IMD layer 118 is insignificant, and therefore a combination of the IMD layer 128' and the patterned IMD layer 118 can be considered as a single IMD layer.

In some embodiments, the IMD layer 128' includes silicon oxide, silicon nitride (SiN), silicon oxynitride, silicon carbide, or the like. In some embodiments, the IMD layer 128' comprises oxide, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

Figure 5:
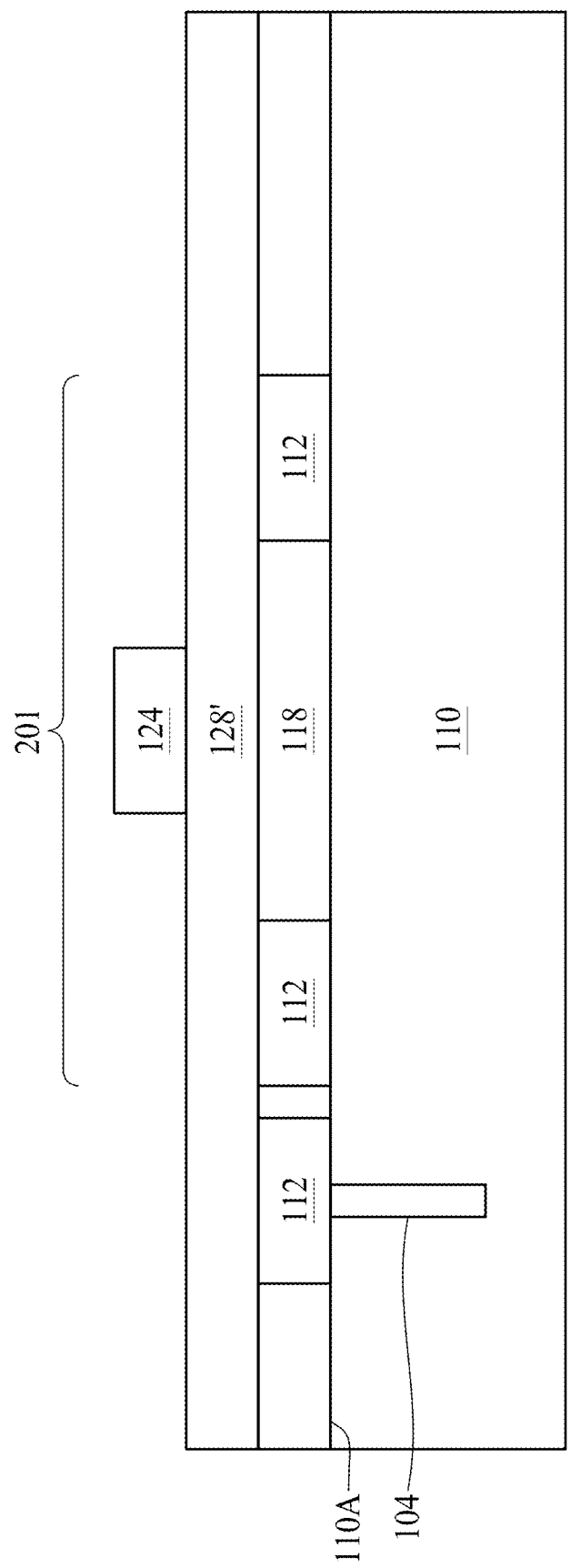

Referring to FIG. 5, a permalloy device 124 is disposed on the IMD layer 128' by a pick and place process. In some embodiments, the permalloy device 124 is picked up by a pick and place head from a platform which providing the permalloy device 124. Then, the permalloy device 124 is placed onto the IMD layer 128' via, for example, a die attach film (DAF) not shown. The permalloy device 124 serves as a magnetic core of the inductor 200. Material of the permalloy device 124 includes permalloy with high permeability coefficient. In some embodiments, material of the permalloy device 124 includes NiFe. Permeability for permalloy of a material of NiFe ranges from about 1,000 to about 1,000,000 H/m. Taking an advantage of high permeability coefficient of material of permalloy, for a given inductance, compared to the conventional inductor, the inductor 200 has a smaller size. In some embodiments, the permalloy device 124 may have a low conductivity in order to mitigate the induced Eddy current.

In some embodiments, before performing a pick and place process, a position where the permalloy device 124 is to be disposed is marked. In some embodiments, the marked position is a center portion between two metal lines of the patterned metal layer 112 in the inductor zone 201.

Referring to FIG. 6, a patterned IMD layer 128 is formed on the patterned IMD layer 118 and the patterned metal layer 112 by patterning the IMD layer 128' shown in FIG. 5. Then, a via layer 113 is formed in the patterned IMD layer 128. The via layer 113 includes vias 114 within the inductor zone 201 and a via 115 outside of the inductor zone 201. Operation of forming the via layer 113 is similar to that of forming the TSV 104 as described in the embodiment of FIG. 1. As such, the similar detailed descriptions are omitted herein.

In some embodiments, material of the via layer 113 is the same as that of the patterned metal layer 112. In some embodiments, the via layer 113 is made of highly conductive materials, such as copper, in order to reduce conduction resistance.

Referring to FIG. 7, a patterned metal layer 121 is formed on the patterned IMD layer 128 and the via layer 113. In some embodiments, the patterned metal layer 121 is a metal 2 (M2) layer. In some embodiments, the patterned metal layer 121 is aligned to the patterned metal layer 112. In further detail, the patterned metal layer 121 includes a metal line 123 outside of the inductor zone 201 and metal lines 122 inside of the inductor zone 201. The metal line 123 is aligned to the left most metal line of the patterned metal layer 112 and the left most via 115 of the via layer 113. The metal line 122 in the inductor zone 201 is aligned to the metal line, also in the inductor zone 201, of the patterned metal layer 112. In addition, the metal line 123 of the patterned metal layer 121 is coupled to the TSV 104 by the via 115 and the metal line of the patterned metal layer 112 below the metal line 123.

After formation of the patterned metal layer 121, a patterned IMD layer 138 is formed on the patterned IMD layer 128. An exemplary process of forming the patterned IMD layer 138 includes CVD, PVD, ALD, spin-on coating, or other suitable operations.

In some embodiments, a planarization operation, such as grinding or CMP, may be utilized to level upper surfaces of the patterned metal layer 121 and the patterned IMD layer 138.

In some embodiments, the patterned metal layer 121 is made of highly conductive materials, such as copper, in order to reduce conduction resistance. In some embodiments, the patterned IMD layer 138 comprises a dielectric material such as silicon oxide, silicon nitride, silicon oxynitride, silicon carbide, or the like. In some embodiments, the patterned IMD layer 138 comprises oxide, such as USG, FSG, BPSG, TEOS, SOG, HDP oxide, PETEOS, or the like.

In some embodiments, the metal lines 122 within the inductor zone 201 may have a circular or polygonal shape serving as a node of conduction electrically coupling the vias 114. In some embodiments, the metal line 122 has a first width greater than a second width of the via 114 from a cross-sectional view of top-view perspective for ensuring robust electrical connection between them. In some embodiments, the metal line 122 has a first area from a top-view perspective greater than a second area of the via 114 from a top-view perspective.

In some embodiments, the via 114, the metal line of the patterned metal layer 112, and the metal lines 122 of the patterned metal layer 121 within the inductor zone 201 that are configured to perform the function of the inductor 200 may be electrically isolated from other conductive components, such as the metal lines 123 or the vias 115 outside the inductor zone 201.

In some embodiments, the metal line 123 and the via 115 outside the inductor zone 201 may be configured for interconnecting devices or components of the semiconductor package device 100 on both sides of the interconnect structure 120.

In some embodiments, the permalloy device 124 is disposed at the same tier as the patterned metal layer 121 and the patterned IMD layer 138. In some embodiments, the permalloy device 124 has a top surface substantially level with the metal lines 122 and 123. In some embodiments, the permalloy device 124 extends between two adjacent metal lines 122. In some embodiments, the permalloy device 124 is not present between the metal lines 122 and 123 immediately adjacent to each other.

In some embodiments, a distance between the metal line 122 at one side of the permalloy device 124 and the permalloy device 124 equals that between the metal line 122 at the other side of the permalloy device 124. As a result, desirable performance of the inductor 200 is achieved.

In some embodiments, a distance between the immediately adjacent metal lines 122 and 123 is shorter than that between the metal line 122 and the permalloy device 124. In some embodiments, a distance between the adjacent metal lines 122 and 123 is equal to that between the metal line 122 and the permalloy device 124. In some embodiments, a distance between the adjacent metal lines 122 and 123 is longer than that between the metal line 122 and the permalloy device 124.

Referring to FIG. 8, a patterned IMD layer 148 is formed on the patterned IMD layer 138 and the patterned metal layer 121. In some embodiments, an interface between the patterned IMD layers 138 and 148 is insignificant, and therefore a combination of the IMD layers 138 and 148 can be considered as a single IMD layer. Operation of forming the patterned IMD layer 148 is similar to that of forming the patterned IMD layer 128 as described in the embodiment of FIG. 6. As such, the similar detailed descriptions are omitted herein.

In some embodiments, the patterned IMD layer 148 includes silicon oxide, silicon nitride (SiN), silicon oxynitride, silicon carbide, or the like. In some embodiments, the patterned IMD layer 148 comprises oxide, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

After the formation of the patterned IMD layer 148, a via layer 313 is formed in the patterned IMD layer 148. The via layer 313 includes vias 314 within the inductor zone 201 and a via 315 outside of the inductor zone 201. Operation of forming the via layer 313 is similar to that of forming the TSV 104 as described in the embodiment of FIG. 1. As such, the similar detailed descriptions are omitted herein.

The vias 314 within the inductor zone 201 are configured as part of the inductor 200 while the via 315 outside of the inductor zone 201 are configured as part of an interconnection path. That is, the via 315 is not configured as part of the inductor 200.

After the formation of the via layer 313, a patterned metal layer 131 is formed on the patterned IMD layer 148 and the via layer 313. In some embodiments, the patterned metal layer 131 is aligned to the patterned metal layer 121. In further detail, the patterned metal layer 131 includes a metal line 133 outside of the inductor zone 201 and a metal line 132 inside of the inductor zone 201. The metal line 133 is aligned to the metal line 123 of the patterned metal layer 121. The metal line 132 is aligned to the metals line 122 of the patterned metal layer 121. In addition, the metal line 133 of the patterned metal layer 131 is coupled to the TSV 104 by the via 315, the metal line 123, the via 115 and the metal line of the patterned metal layer 112 below the metal line 123.

The metal line 132 inside of the inductor zone 201 is configured as part of the inductor 200, and the metal line 133 outside of the inductor zone 201 is configured as part of an interconnection path. That is, the metal line 133 is not configured as part of the inductor 200. In the depicted example, the metal line 132 electrically connects two adjacent metal lines 122 at two sides of the permalloy device 124 and extends over and across the permalloy device 124.

In some embodiments, in a cross-sectional view as shown in FIG. 8, a distance between the metal line 122 at one side of the permalloy device 124 and the permalloy device 124, a distance between the metal line 122 at the other side of the permalloy device 124 and the permalloy device 124, and a distance between the metal line 132 and the permalloy device 124 are equal to each other. As a result, desirable performance of the inductor 200 is achieved.

In some embodiments, in a cross-sectional view as shown in FIG. 8, a distance between the metal line 132 and the permalloy device 124 is shorter than that between the substrate 110 and the permalloy device 124. As a result, desirable performance of the inductor 200 is achieved.

FIG. 9A is a schematic perspective view of the inductor 200 in the semiconductor package device 100, in accordance with some embodiments. Referring to FIG. 8 and FIG. 9A, the cross-sectional view of the inductor zone 201 in FIG. 8 is taken from a sectional line AA in FIG. 9A. In FIG. 9A, the inductor 200 includes a conductive coil 910 and a magnetic core 920. The conductive coil 910 is comprised of a bottom metal layer 902, a middle metal layer 904 and a top metal layer 906 interconnected to each other.

The metal lines in the bottom metal layer 902 and top metal layer 906 correspond to the metal line 132 and the metal line of the patterned metal layer 112, respectively, of the interconnect structure 120 in FIG. 8. Further, the illustration of an exemplary middle metal layer 904 on the left side of FIG. 9A shows the details of its structure including the metal line and the vias 114 and 314 corresponding to those of the interconnect structure 120 in FIG. 8.

Moreover, the magnetic core 920 of FIG. 9A corresponds to the permalloy device 124 in FIG. 8. It can be seen in FIG. 9A that the conductive coil 910 has a helical shape, which surrounds and winds around the magnetic core 920. In the depicted embodiment, the magnetic core 920 is wound by the conductive coil 910 by nine turns, where one turn is made up of one bottom metal layer 902, two middle metal layers 904 and one top metal layer 906.

In some embodiments, the metal lines of the top metal layer 906 are staggered with those in the bottom metal layer 902 in order to form the helical structure of the conductive coil 910. Although the conductive coil 910 and the magnetic core 920 may be closely disposed, they are electrically insulated by the IMD, as shown in FIG. 8. In some embodiments, the magnetic core 920 is fully encapsulated by an IMD layer. In some embodiments, the magnetic core 920 is electrically isolated from other conductive features of the interconnect structure 120.

Still referring to FIG. 9A, an input port 912 and an output port 914 are configured to electrically couple the conductive coil 910 with external conductive features. In some embodiments, the inductor 200 conductively couples to other features through only the input port 912 and the output port 914. In some embodiments, the input port 912 and the output port 914 are disposed at the tier of the bottom metal layer 902 and are formed from the metal line of the patterned metal layer 112. However, the present disclosure is not limited thereto. In other embodiments, depending on design needs, the input port 912 or the output port 914 can be alternatively formed at the tier of the top metal layer 906 and can be formed of the metal lines 132.

In some embodiments, the magnetic core 920 has a circular shape or a ring shape. In some embodiments, the magnetic core 920 has a polygonal ring shape. In some embodiments, the cross section of the magnetic core 920 has a quadrilateral shape (e.g., square, rectangle or trapezoid), as illustrated by the region of the permalloy device 124 in FIG. 8.

In some embodiments, referring to FIG. 8 or FIG. 9A, a diameter D1 of the permalloy device 124 or 920 is between about 10 μm and about 30 μm. In some embodiments, the diameter D1 is between about 10 μm and about 20 μm. In some embodiments, a diameter D2 of the metal line or the conductive coil 910 is between about 10 μm and about 30 μm. In some embodiments, the diameter D2 is between about 10 μm and about 20 μm. In some embodiments, the diameter D1 is substantially equal to the diameter D2. In some embodiments, a distance D3 between the conductive coil 910 and the magnetic core 920 is between about 10 μm and about 30 μm.

Figure 9B:
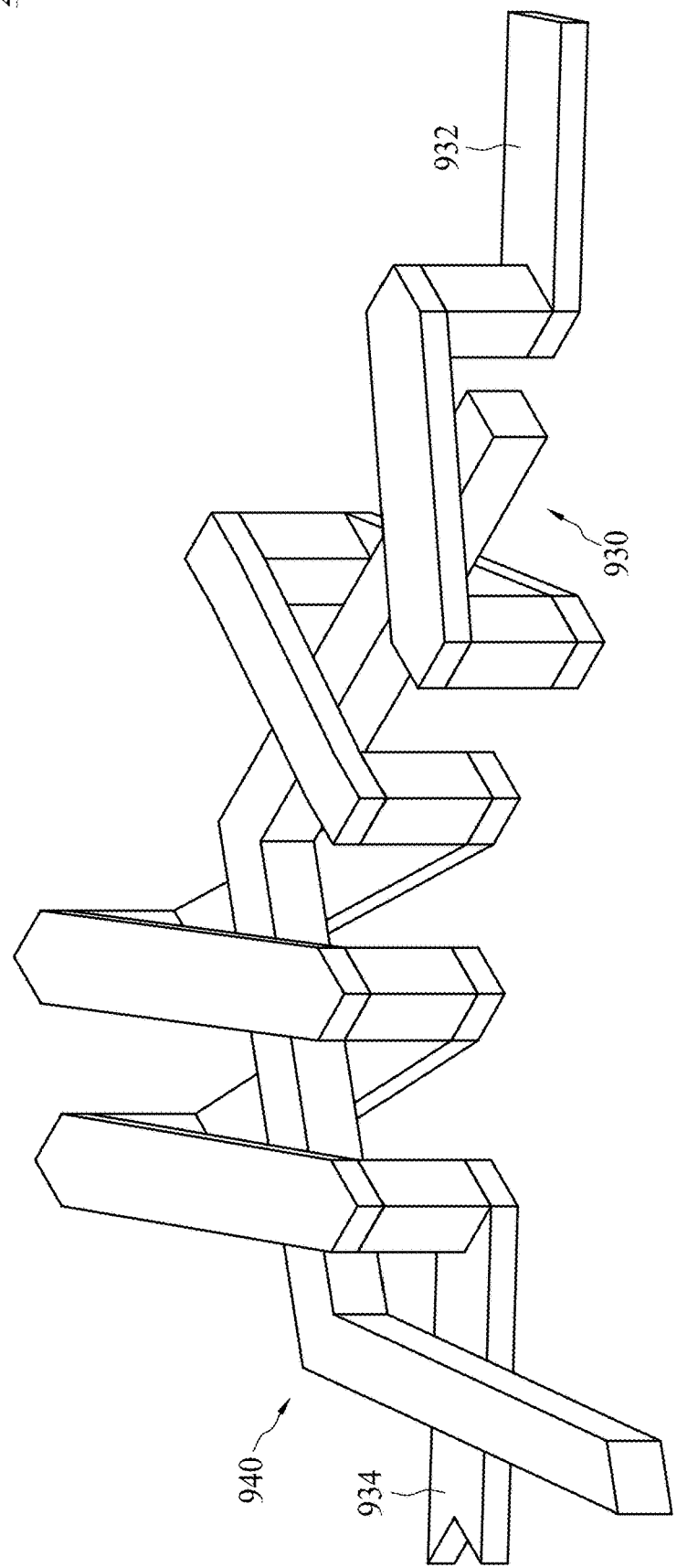

FIG. 9B is a schematic perspective view of an inductor 230 in the semiconductor package device 100, in accordance with some embodiments. Referring to FIG. 9B, the inductor 230 has a conductive coil 930 and a magnetic core 940, around which the conductive coil 930 is wound.

Compared to the inductor 200 shown in FIG. 9A, the inductor 230 is similar to the inductor 200 described and illustrated with reference to FIG. 9A except that, for example, the configuration of the magnetic core 940 of the inductor 230 has a bar or strip shape. In some embodiments, the magnetic core 940 has two ends extending in substantially opposite directions. In some embodiments, the conductive coil 930 has an input port 932 and an output port 934 at the two ends of the magnetic core 940.

Figure 10:
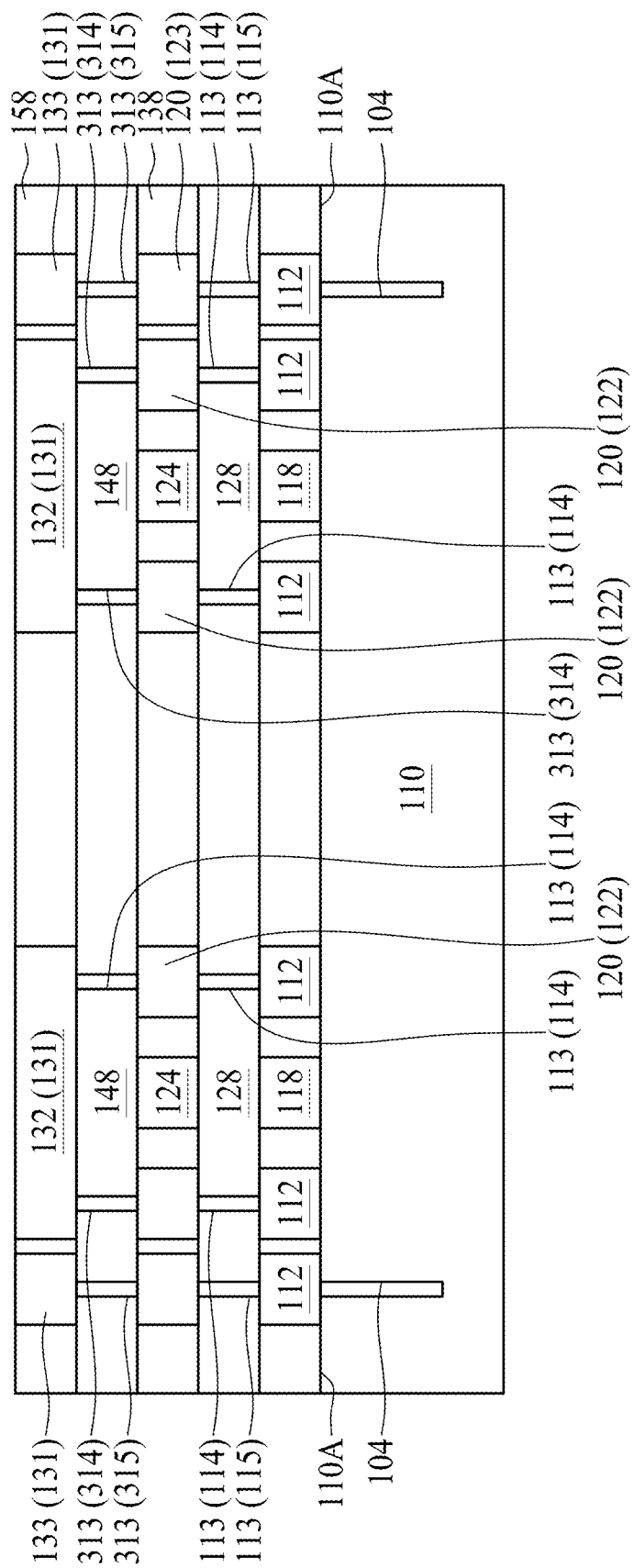
FIGS. 10 through 15 are cross-sectional views of intermediate structures for a method of manufacturing a semiconductor package device, in accordance with some embodiments.
Figure 11:
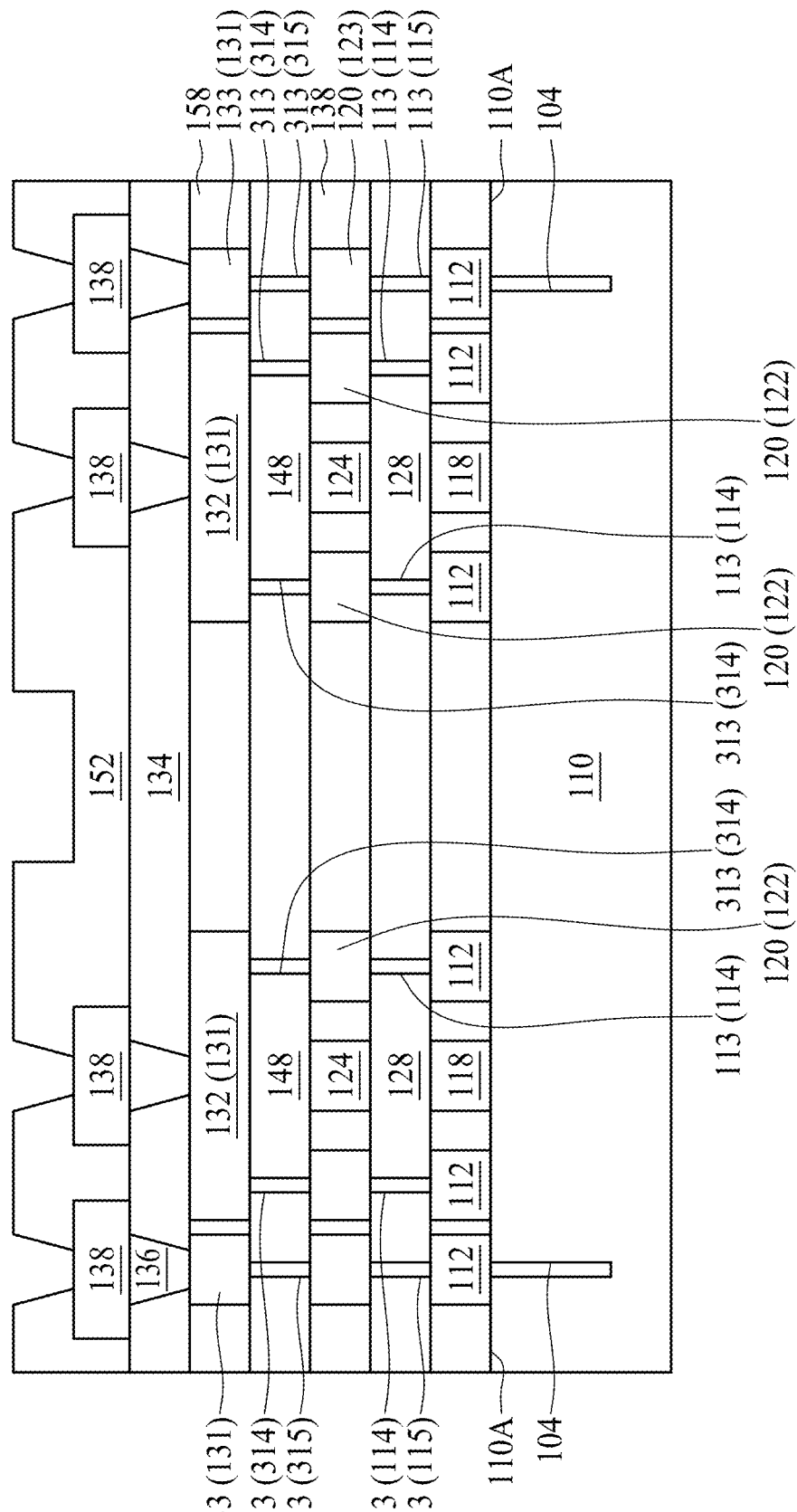

It should be noted that in FIG. 10 and the subsequent embodiments shown in FIGS. 11 to 15, one inductor 200 is depicted. FIG. 11 shows the formation of an insulating film 134 of the interconnect structure 120. Referring to FIG. 11, the insulating film 134 may be formed of a dielectric material, such as oxide, nitride, oxynitride, carbide, or the like. In some embodiments, the insulating film 134 is formed of the same material as the IMD in the interconnect structure 120. The insulating film 134 may be formed using CVD, PVD, spin-coating, or the like.

Subsequently, several conductive vias 136 are formed through the insulating film 134. The material and method of the manufacture of the conductive vias 136 may be similar to those of vias of the via layer 113 of the interconnect structure 120. Some of the conductive vias 136 are electrically coupled to the metal lines 133 while some other conductive vias 136 are electrically coupled to the metal lines 132 of the conductive coil.

Several conductive pads 138 are formed on the surface of the insulating film 134 and the conductive vias 136 to electrically couple to the conductive vias 136. The conductive pads 138 may be formed of copper, aluminum, tungsten, titanium, combinations thereof, or the like. Next, a passivation layer 152 is formed over the insulating film 134 and the conductive pads 138. The passivation layer 152 may be formed in a blanket manner using CVD, PVD, spin-coating, or the like. The passivation layer 152 may comprise a dielectric material such as oxide, nitride, or oxynitride. Moreover, the passivation layer 152 is patterned to expose the conductive pads 138. The resultant semiconductor structure in FIG. 10 may be referred to as an interposer die 150.

Figure 12:
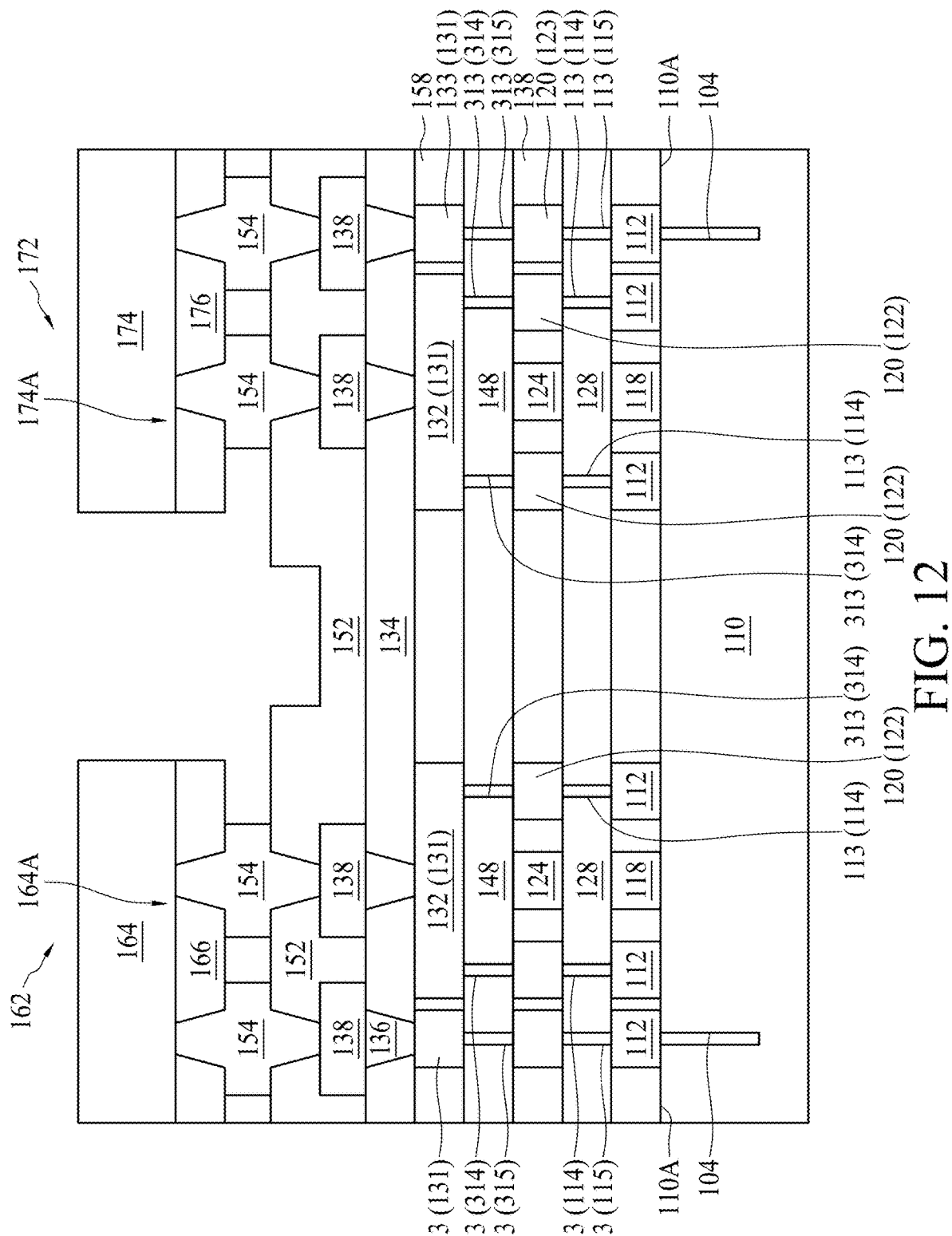

Referring to FIG. 12, a first semiconductor die 162 and a second semiconductor die 172 are provided or received. In some embodiments, the first semiconductor die 162 or the second semiconductor die 172 is a memory device, a processor device, a communication receiver or transmitter, a power management die, a transformer die, or the like. The first semiconductor die 162 and the second semiconductor die 172 comprise a first substrate (also called a die substrate) 164 and a second substrate 174, respectively. The substrate 164 or 174 includes a semiconductor material, such as silicon. In one embodiment, the substrate 164 may include other semiconductor materials, such as silicon germanium, silicon carbide, gallium arsenide, or the like. The substrate 164 or 174 may be a p-type semiconductive substrate (acceptor type) or an n-type semiconductive substrate (donor type).

Various components may be formed on a front surface (front side) 164A of the first substrate 164 and a front surface 174A of the second substrate 174. Examples of the components include active devices, such as transistors and diodes, and passive devices, such as capacitors, inductors, and resistors. The components may also include conductive elements, such as conductive traces or vias, and insulating materials. In addition, the semiconductor die 162 or 172 comprises one or more connection terminals (not illustrated) electrically coupled to external circuits or devices through the connection terminals.

A first passivation layer 166 and a second passivation layer 176 are formed on the first substrate 164 and the second substrate 174, respectively. The connection terminals of the semiconductor die 162 or 172 are exposed through the first passivation layer 166 or the second passivation layer 176. The first passivation layer 166 or the second passivation layer 176 may be formed of dielectric materials, such as oxide, nitride, or the like.

Conductive connectors 154 are formed to bond the interposer die 150 shown in FIG. 10 with the semiconductor dies 162 and 172. In further detail, the connection terminals of the first semiconductor die 162 and the second semiconductor die 172 are electrically coupled to the conductive pads 138 of the interposer die 150. In some embodiments, the conductive connectors 154 may be contact bumps such as controlled collapse chip connection (C4) bumps, ball grid array bumps or microbumps.

Figure 13:
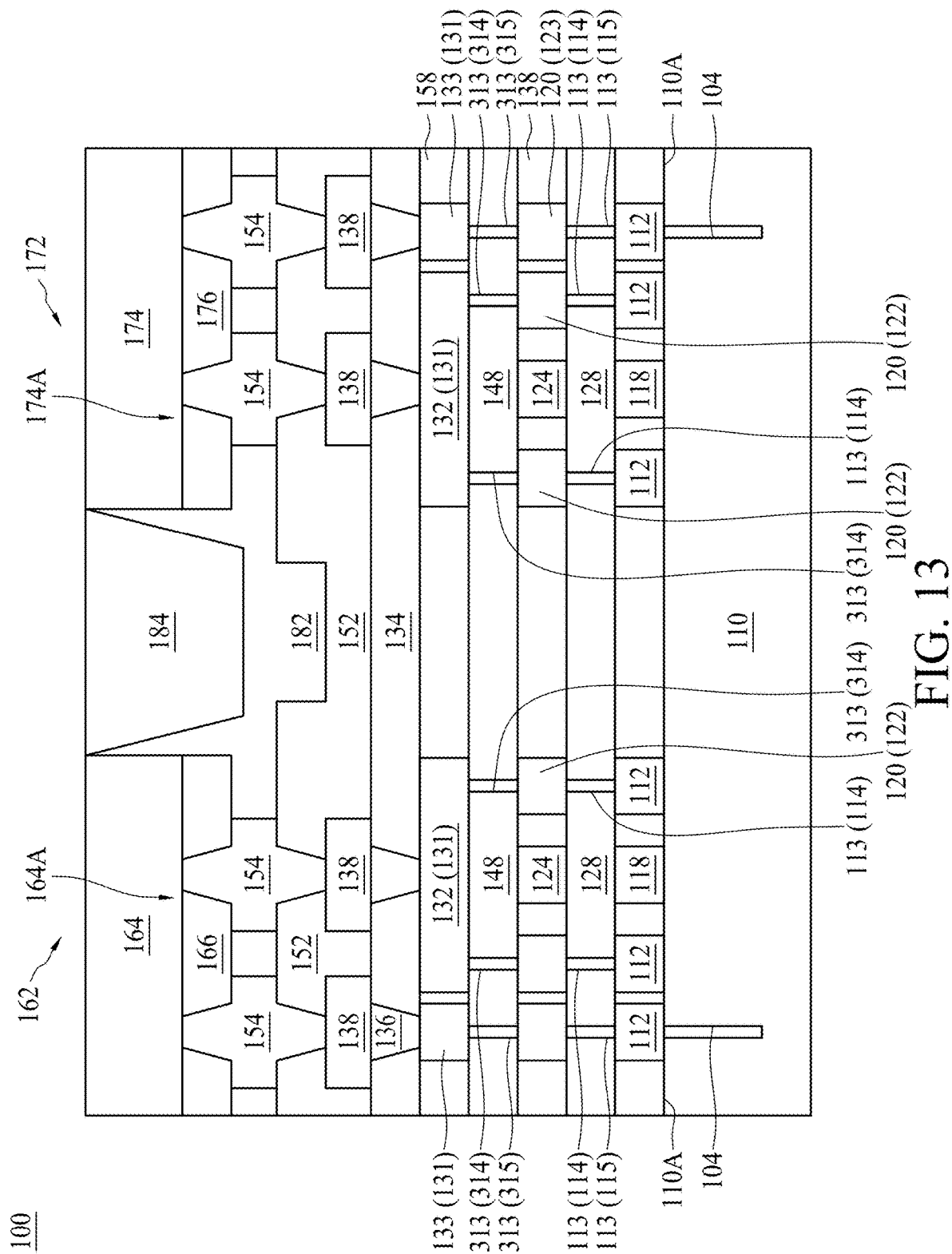

FIG. 13 shows the forming of an encapsulating material 182. Referring to FIG. 13, the encapsulating material 182 encapsulates or surrounds the conductive connectors 154, the semiconductor dies 162 and 172, and the passivation layer 152 of the interposer die 150. The encapsulating material 182 may include a molded underfill material. In some embodiments, the encapsulating material 182 is formed of epoxy, deformable gel, silicon rubber, thermal plastic polymer, combinations thereof, or the like. In other embodiments, the encapsulating material 182 includes a filler material. The encapsulating material 182 may be formed by dispensing, injecting, or spraying techniques.

Subsequently, an encapsulating material 184 is applied to fill the gap of the encapsulating material 182 between the semiconductor dies 162 and 172. In some embodiments, the encapsulating material 184 fills the gaps between the interposer die 150 and the semiconductor dies 162 and 172. In some embodiments, the encapsulating material 184 includes a molding compound such as polyimide, PPS, PEEK, PES, a molding underfill, an epoxy, a resin, or a combination thereof. The encapsulating material 184 may be formed by dispensing, injecting, or spraying techniques.

Once the molding material 182 or 184 has been formed, a thinning or planarization process may be performed for removing excess encapsulating material 182 or 184. The thinning and planarization operation may be performed using a mechanical grinding or CMP method. In some embodiments, the upper surfaces of the encapsulating materials 182/184 and the semiconductor dies 162 and 172 are substantially level with one another.

Figure 14:
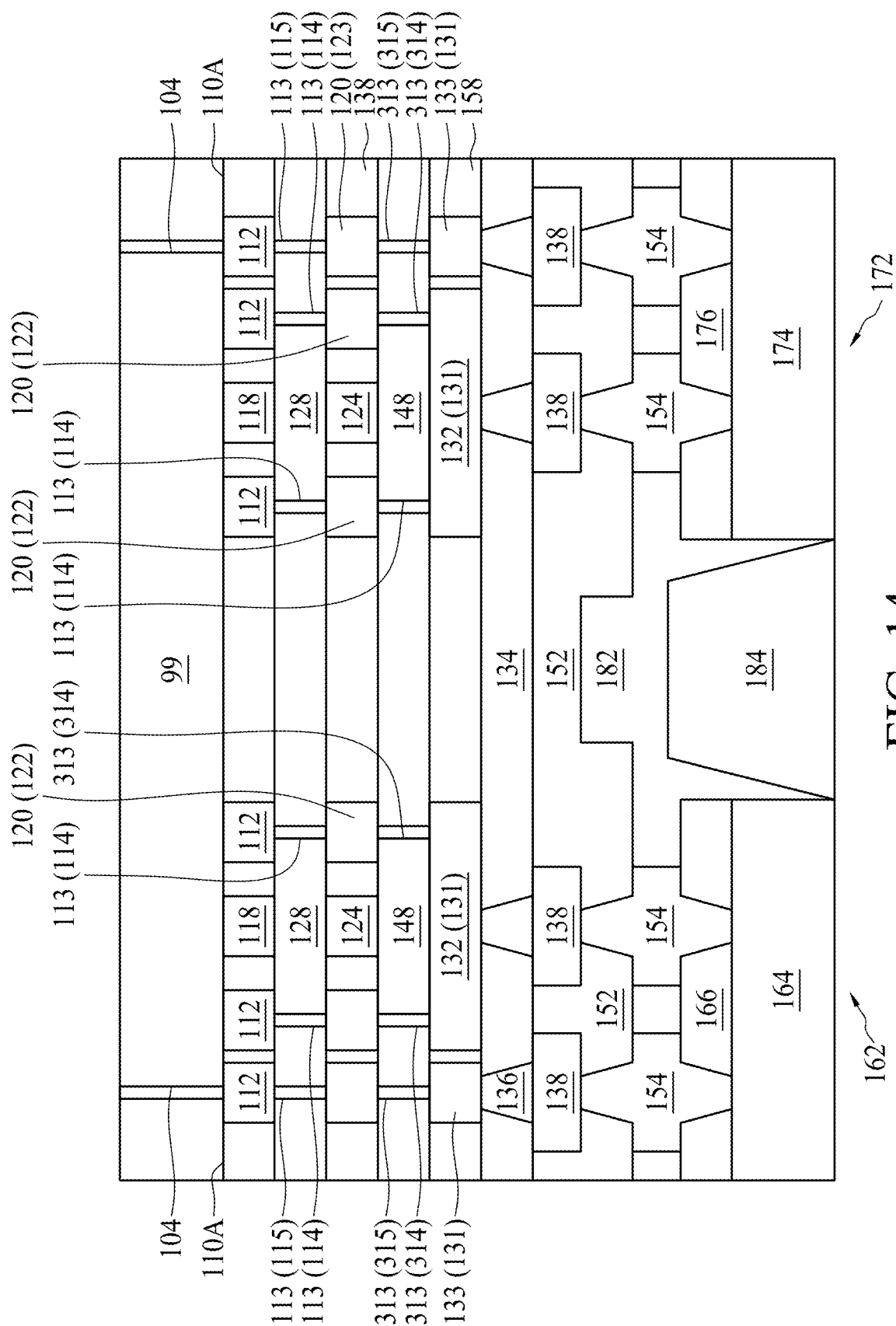

The semiconductor package device 100 shown in FIG. 13 is then flipped, as shown in FIG. 14. Referring to FIG. 14, the substrate 110 is thinned so as to expose the bottoms of the TSV 104, resulting in a thinned substrate 99. The thinning and planarization operation may be performed using a mechanical grinding or CMP method.

Figure 15:
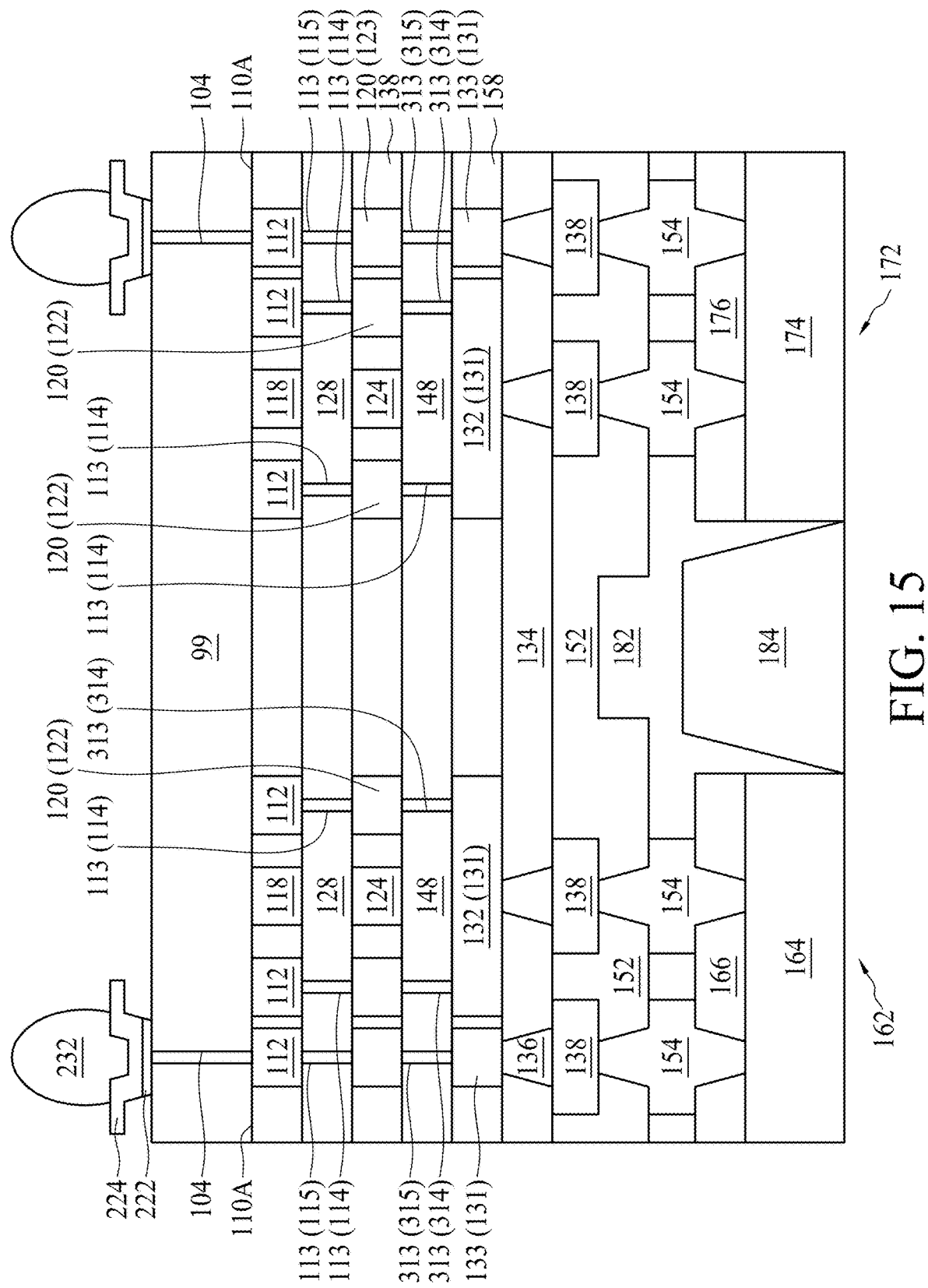

Subsequently, FIG. 15 illustrates a formation of external connectors 232. Initially, a conductive pad 222 and an under bump metallization (UBM) 224 are sequentially formed over the TSV 104. In some embodiments, the conductive pad 222 may comprise a single layer or a multilayer structure. For example, the conductive pad 222 comprises copper, cooper alloy, tin, nickel, nickel alloy, combinations, or the like. In an embodiment, the UBM 224 may comprise a diffusion barrier layer, a seed layer, or a seed layer over a diffusion barrier layer. In some embodiments, the diffusion barrier layer may include titanium, titanium nitride, tantalum, tantalum nitride, or the like. In some embodiments, the seed layer may comprise copper or copper alloys. The conductive pad 222 and the UBM 224 may be formed by CVD, PVD, sputtering or other suitable methods.

Next, a solder material 232 is formed over the UBM 224. In some embodiments, the solder material 232 comprises lead-based materials, such as Sn, Pb, Ni, Au, Ag, Cu, Bi, combinations thereof, or mixtures of other electrically conductive material. In an embodiment, the solder material 232 is a lead-free material. A thermal process may be performed on the solder material 232, forming an external connector 232. In some embodiments, the external connector 232 comprises a spherical shape. However, other shapes of the external connector 232 may be also possible. In some embodiments, the external connector 156 may be C4 bumps, ball grid array bumps, or microbumps.

The present disclosure provides advantages. The proposed µm-level on-chip inductor is advantageous due to its reduced size and at least 10-times higher permeability coefficient compared to conventional millimeter-level inductors. In addition, compared to an existing on-chip inductor configuration in which an inductor core made of conductive material is wrapped by a magnetic coil, the proposed inductor adopts a conductive coil winding around a magnetic core. When working in conjunction with an on-chip capacitor in power management applications, the proposed inductor configuration provides a better charging performance than the existing conductive-core configuration.

The present disclosure provides a method of manufacturing a semiconductor device. A permalloy device is received. An interposer die is formed. A conductive coil is formed over a substrate, and the conductive coil includes a bottom metal layer over the substrate, a middle metal layer and a top metal layer interconnected to each other. The permalloy device is disposed in the middle metal layer through a pick and place operation before forming the top metal layer of the conductive coil. A semiconductor die is bonded to the interposer die. The permalloy device has a polygonal ring shape wrapped with the conductive coil.

The present disclosure provides a method of manufacturing a semiconductor device. A semiconductor substrate is received. A permalloy device attached with a die attach film (DAF) is received. An interposer die is formed. A first layer of a multi-layer structure is formed over the semiconductor substrate. The permalloy device is disposed on the first layer. A second layer of the multi-layer structure is formed in the same tier as the permalloy device and over the first layer. A third layer of the multi-layer structure is formed over the second layer and the permalloy device, and the third layer extends over and across the permalloy device. The multi-layer structure includes a conductive coil formed by horizontally-extending metal lines and vertically-extending vias electrically connecting the horizontally-extending metal lines. The permalloy device is wound around by and insulated from the conductive coil.

The present disclosure provides a method of manufacturing a semiconductor device. A permalloy device with a die attach film (DAF) is received. A substrate is received. A first semiconductor die and a second semiconductor die are provided over the substrate. An interconnect structure is formed between the substrate and the first semiconductor die. A first layer of a plurality of patterned layers is formed over the substrate. The permalloy device is placed on the first layer. A second layer of the plurality of the patterned layers is formed in the same tier as the permalloy device, and the permalloy device is disposed between two adjacent metal lines of the second layer. A third layer of the plurality of the patterned layers is formed over the second layer of the plurality of the patterned layers and the permalloy device. A plurality of via layers are formed over the substrate. The plurality of the patterned layers and the plurality of the via layers form a conductive coil of an inductor, and the permalloy device forms a magnetic core of the inductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    receiving a permalloy device;
    forming an interposer die, comprising:
        forming a conductive coil over a substrate, wherein the conductive coil comprises a bottom metal layer over the substrate, a middle metal layer and a top metal layer interconnected to each other;
        disposing the permalloy device in the middle metal layer through a pick and place operation before forming the top metal layer of the conductive coil;
        forming an inter-metal-dielectric layer to laterally surround the permalloy device in the middle metal layer after disposing the permalloy device; and
    bonding a semiconductor die to the interposer die,
    wherein the permalloy device has a polygonal ring shape wrapped with the conductive coil.

2. The method according to claim 1, wherein forming the conductive coil over the substrate further comprises:
    forming the bottom metal layer over the substrate;
    forming a first dielectric layer over the bottom metal layer;
    patterning the first dielectric layer when the permalloy device is disposed on the first dielectric layer through a die attach film (DAF);

forming a patterned metal layer in the same tier as the permalloy device and over the patterned first dielectric layer;

forming and patterning a second dielectric layer over the patterned metal layer; and forming the top metal layer over the second dielectric layer, wherein the middle metal layer comprises the patterned first dielectric layer, the patterned metal layer and the patterned second dielectric layer.

3. The method according to claim 1, wherein disposing the permalloy device in the middle metal layer through the pick and place operation further comprises:

attaching a die attach film (DAF) to the permalloy device and transporting the permalloy device over the bottom metal layer through the pick and place operation, wherein the permalloy device is separated from the bottom metal layer by a dielectric layer.

4. The method according to claim 1, further comprising forming a conductive bump on a surface of the substrate opposite the conductive coil and electrically coupled to the semiconductor die.

5. A method of manufacturing a semiconductor device, comprising:

receiving a semiconductor substrate;

receiving a permalloy device attached with a die attach film (DAF); and forming an interposer die, comprising:

forming a first layer of a multi-layer structure over the semiconductor substrate;

disposing the permalloy device on the first layer;

forming a second layer of the multi-layer structure in the same tier as the permalloy device and over the first layer;

forming an inter-metal-dielectric layer to laterally surround the permalloy device in the second layer after disposing the permalloy device; and forming a third layer of the multi-layer structure over the second layer and the permalloy device, wherein the third layer extends over and across the permalloy device, wherein the multi-layer structure comprises a conductive coil formed by horizontally-extending metal lines and vertically-extending vias electrically connecting the horizontally-extending metal lines, wherein the permalloy device is wound around by and insulated from the conductive coil.

6. The method according to claim 5, wherein the multi-layer structure further comprises:

a dielectric material configured to electrically insulate the permalloy device from the conductive coil, wherein the dielectric material comprises at least one of oxide, nitride or carbide.

7. The method according to claim 5, wherein the conductive coil comprises copper.

8. The method according to claim 5, wherein the permalloy device is aligned with a predetermined location of the first layer through a mark prior to disposing the permalloy device.

9. The method according to claim 5, wherein the permalloy device comprises NiFe.

10. The method according to claim 5, wherein the permalloy device comprises a permeability coefficient between from about 1,000 to about 1,000,000 H/m.

11. The method according to claim 5, wherein the conductive coil comprises the first layer, the second layer and the third layer, and the permalloy device is disposed at the same tier of the second layer, wherein the second layer is disposed between the first layer and the third layer.

12. The method according to claim 11, wherein the second layer is a metal-2 (M2) layer.

13. The method according to claim 11, wherein the conductive coil further comprises:

a via layer coupled between the first layer and the second layer, wherein a first metal line of the first layer has a width greater than that of a via of the via layer.

14. The method according to claim 13, wherein a distance between the permalloy device and a second metal line of the second layer is equal to a distance between the permalloy device and a third metal line of the second layer, wherein the permalloy device is disposed between the second metal line and the third metal line of the second layer.

15. A method of manufacturing a semiconductor device, comprising:

receiving a permalloy device with a die attach film (DAF);

receiving a substrate;

providing a first semiconductor die and a second semiconductor die over the substrate, wherein an interconnect structure is disposed between the substrate and the first semiconductor die;

forming the interconnect structure between the substrate and the first semiconductor die, comprising:

forming a first layer of a plurality of patterned layers over the substrate;

placing the permalloy device on the first layer;

forming a second layer of the plurality of the patterned layers in the same tier as the permalloy device, wherein the permalloy device is disposed between two adjacent metal lines of the second layer;

forming an inter-metal-dielectric layer to laterally surround the permalloy device in the second layer after placing the permalloy device; and forming a third layer of the plurality of the patterned layers over the second layer of the plurality of the patterned layers and the permalloy device; and forming a plurality of via layers over the substrate, wherein the plurality of the patterned layers and the plurality of the via layers form a conductive coil of an inductor, and the permalloy device forms a magnetic core of the inductor.

16. The method according to claim 15, wherein the permalloy device is aligned with a predetermined location of the first layer of the plurality of the patterned layers through a mark prior to placing the permalloy device.

17. The method according to claim 15, further comprising:

forming a conductive bump on a surface of the substrate opposite the interconnect structure, wherein the conductive bump is electrically coupled to the first semiconductor die and the second semiconductor die through the interconnect structure.

18. The method according to claim 15, wherein the permalloy device is separated from the two adjacent metal lines of the second layer by the inter-metal-dielectric layer.

19. The method according to claim 15, further comprising:

forming a conductive connector electrically coupling the interconnect structure with the first semiconductor die.

20. The method according to claim 19, further comprising:

forming a dielectric material encapsulating the interconnect structure, the first semiconductor die and the conductive connector.

\* \* \* \* \*